(12) United States Patent
Cheah et al.

(10) Patent No.: US 8,188,766 B1
(45) Date of Patent: May 29, 2012

(54) SELF-CONTAINED SYSTEMS INCLUDING SCALABLE AND PROGRAMMABLE DIVIDER ARCHITECTURES AND METHODS FOR GENERATING A FREQUENCY ADJUSTABLE CLOCK SIGNAL

(75) Inventors: Kok Leong Christopher Cheah, Singapore (SG); Cheng Huat Tan, Singapore (SG); Kim Yong Lee, Singapore (SG)

(73) Assignee: Avago Technologies Enterprise IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 13/024,633

(22) Filed: Feb. 10, 2011

(51) Int. Cl.
*H03K 19/00* (2006.01)
(52) U.S. Cl. ............................ 326/93; 326/21; 326/38
(58) Field of Classification Search .......... 326/21, 326/26, 27, 37–41, 46, 93–98
See application file for complete search history.

(56) References Cited

U.S. PATENT DOCUMENTS

| | | | |
|---|---|---|---|
| 5,805,871 A | 9/1998 | Baxter | |
| 5,838,205 A | 11/1998 | Ferraiolo et al. | |
| 6,049,254 A | 4/2000 | Knapp et al. | |
| 6,622,255 B1* | 9/2003 | Kurd et al. | 713/503 |
| 7,358,783 B1* | 4/2008 | Wang et al. | 327/156 |
| 7,471,160 B2 | 12/2008 | Feng et al. | |
| 7,532,029 B1 | 5/2009 | Asaduzzaman et al. | |
| 7,602,226 B1* | 10/2009 | Hwang et al. | 327/291 |
| 2008/0238502 A1* | 10/2008 | Song et al. | 327/149 |
| 2011/0012656 A1* | 1/2011 | Sumita | 327/163 |
| 2011/0204943 A1* | 8/2011 | Song et al. | 327/158 |

* cited by examiner

*Primary Examiner* — Don Le

(57) ABSTRACT

The present systems and methods extend the frequency range of a clock signal generated with a phase-locked loop (PLL). The PLL receives a reference signal from a reference signal divider and a feedback signal from a feedback signal divider. The PLL generates an output signal that is forwarded to a programmable divider. The programmable divider includes control logic, core logic, and post-processing logic. The control logic synchronizes signals distributed throughout the system to prevent metastability. The core logic generates a divide-by-N waveform that is forwarded to the post-processing logic. The post-processing logic generates a half duty cycle clock signal responsive to the divide-by-N waveform.

22 Claims, 8 Drawing Sheets

SELF-CONTAINED SYSTEMS INCLUDING SCALABLE AND PROGRAMMABLE DIVIDER ARCHITECTURES AND METHODS FOR GENERATING A FREQUENCY ADJUSTABLE CLOCK SIGNAL

BACKGROUND

With increasing levels of circuit, circuit board, and system integration, power consumption and heat dissipation are problems of growing concern at all three integration levels. Heat generated from power consumption that is not sufficiently dissipated or removed from a system enclosure increases circuit element temperature and degrades circuit performance and reliability. Therefore, reducing power consumption and integrated circuit operation temperature is of significant importance.

To date, reduction of integrated circuit temperature is accomplished in two ways: lowering the power consumption, and improving heat dissipation to the ambient environment. The first method is the preferred approach. A lowering of the power consumption is usually accomplished by scaling down the power supply voltage. The power supply voltage of integrated circuits has decreased from 5.0 volts several years ago to approximately 1.2 volts. However, further lowering of a power supply voltage will negatively impact the performance of the device. Because of the non-scalability of the built-in voltage of a silicon junction, there is little room for further reduction of the power supply voltage below about 1.2 volts if traditional semiconductor technology is used. Thus, for high performance very large scale integration (VLSI) and ultra large scale integration (ULSI) circuits, further lowering of the power supply voltage is not expected to be an effective approach.

In complimentary metal-oxide semiconductor (CMOS) synchronous digital systems, power consumption is a direct function of clock frequency. Accordingly, one way to conserve power in a digital system implemented with CMOS integrated circuits is to reduce the clock frequency. Thus, if system activity is determined to be below full capacity, the system clock can be controllably reduced to optimally reduce power consumption in the digital system.

A phase-locked loop (PLL) is a feedback-based control system that generates an output signal having a frequency that, through the feedback control, is urged into a fixed frequency relationship with an input reference signal. PLLs are used in frequency synthesizers, data transmission and recovery devices, and other applications where a stable clock signal is desired. As illustrated in FIG. 1, a conventional PLL 10 includes a phase-frequency detector (PFD) 12, a loop filter 14, a voltage-controlled oscillator (VCO) 16, and feedback divider 18. The PLL 10 outputs a signal that is generated by VCO 16 and has a frequency $F_{out}$. The feedback divider 18 receives and divides the frequency of $F_{out}$ and provides the resulting divided-frequency (clock) signal (DIVCLK) to PFD 12, which also receives a reference clock signal (REFCLK). In response to the reference clock signal and the divided-frequency signal, the PFD 12 provides an UP signal or a DOWN signal to loop filter 14 depending on the relationship between the REFCLK and DIVCLK signals. In response to the UP and DOWN signals, loop filter 14 provides an analog voltage signal (V_CNTRL) that controls VCO 16. The output signal frequency $F_{out}$ is proportional to the analog voltage signal. Frequency lock is achieved when the respective frequencies of the DIVCLK and REFCLK signals are identical.

PLLs, such as that shown in FIG. 1, are well-known. PLLs having switchable operating characteristics are also known. For example, spread-spectrum PLLs are known that have an adjustable output clock. However, the variation in the output clock is periodic and the output frequency range is rather limited to be useful for network routers and switches.

SUMMARY

The present systems and methods significantly extend the controllable frequency range of a clock signal. Scalable and programmable dividers are introduced at the input, output, and within the negative feedback loop of a PLL, respectively. The resulting system is capable of adjusting the dividers in real time to control PLL input and output clock signals. A programmable divider applies separate logic paths to minimize signal skew and duty cycle distortion introduced by semiconductor manufacturing process variation as well as variation in supply voltage and temperature when the system is in operation. The separate logic paths each include post-processing logic that maintain a half-duty cycle signal at a system output without requiring a system reset.

An embodiment comprises a method for generating a frequency adjustable clock signal. Briefly described, the method comprises the steps of buffering a reference clock signal with a reference signal divider, coupling an output of the reference signal divider to an input of a PLL, buffering an output of the PLL with a feedback signal divider and forwarding the output of the PLL to a programmable divider. The programmable divider applies separate logic paths to minimize skew and duty cycle distortion.

Another embodiment comprises a self-contained clock generator that generates a frequency adjustable clock signal. Briefly described, the self-contained clock generator comprises a reference signal divider, a phase-locked loop, and a programmable divider. Each of the dividers is coupled to the PLL. The PLL receives a first periodic signal from the reference signal divider. The first periodic signal is responsive to a reference clock provided to the reference signal divider. The output of the PLL is coupled to an input of the programmable divider. The programmable divider includes control logic, core logic, and post-processing logic. The core logic generates a divide-by-N waveform that is forwarded to the post-processing logic. The post-processing logic generates a half duty cycle clock signal responsive to the divide-by-N waveform. The reference signal divider and the programmable divider are responsive to real-time changes in respective inputs and enable the clock generator to control PLL input and PLL output clock signals.

Other systems, methods, features and advantages will be or will become apparent to one skilled in the art upon examination of the following figures and detailed description of the programmable divider architectures. All such additional systems, methods, features and advantages are defined by the accompanying claims.

BRIEF DESCRIPTION OF THE DRAWINGS

The present systems and methods for extending the output frequency range of a clock signal generated with a PLL, as defined in the claims, can be better understood with reference to the following drawings. The components within the drawings are not necessarily to scale relative to each other; emphasis instead is placed upon clearly illustrating the principles for controllably dividing input and output signals to generate a system output having a broad range of frequencies without requiring a system reset.

DETAILED DESCRIPTION

Figure 1:
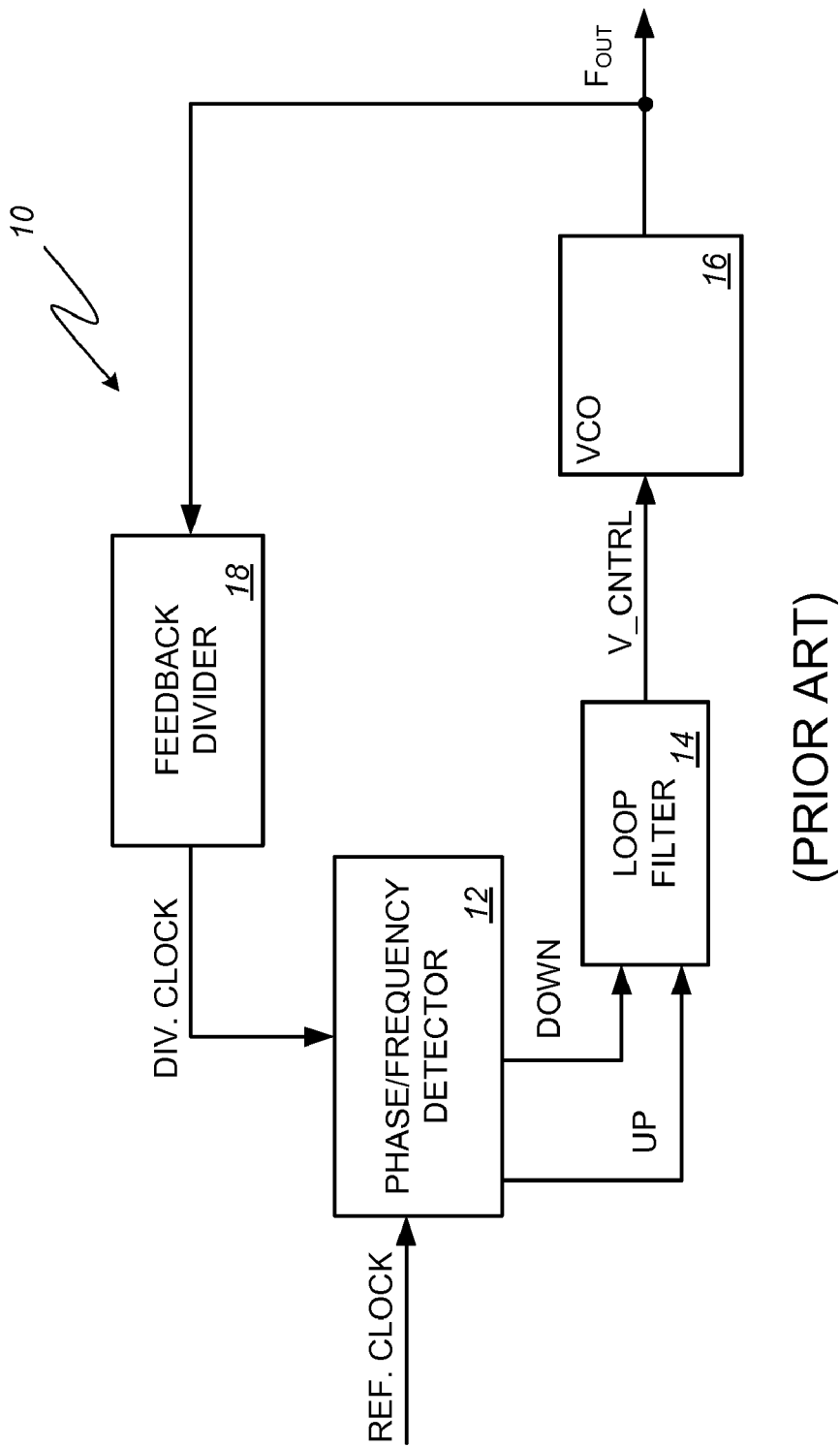
FIG. 1 is a functional block diagram illustrating an embodiment of a PLL.

The following systems and methods, as illustrated and described in association with the example embodiments, significantly extend the controllable frequency range of a clock signal generated with a VCO based PLL. Scalable and programmable dividers are introduced at the input, output, and within a negative feedback loop of the PLL, respectively.

A programmable divider is coupled to an output of the PLL. A reference signal divider is provided at an input to the PLL. The reference signal divider is a scaled version of the programmable divider. A feedback signal divider is inserted in a negative feedback path of the PLL. In a preferred embodiment, the feedback signal divider is implemented by coupling two reference signal dividers in series. Each of the reference signal divider, the feedback signal divider, and the programmable divider are responsive to synchronized signals distributed by respective control logic. The control logic ensures that the respective input signals to each of the dividers are properly conditioned to avoid metastability. Internally, synchronization between the different signal paths is essential. For example, as will be obvious later, the transition to a bypass mode when the respective divider is directed to apply a divisor value of one is only valid at specific timing windows.

Each of the reference signal divider, the feedback signal divider, and the programmable divider include respective core logic. The core logic uses a sequential counter to generate a divide-by-N waveform that is forwarded to the post-processing logic. The post-processing logic of each of the respective dividers generates an output signal responsive to the divide-by-N waveform. Each of the reference signal divider, the feedback signal divider and the programmable divider are responsive to real-time changes in respective inputs. The combination of the reference signal divider, the feedback signal divider and the programmable signal divider is used to achieve real-time control of phase-locked loop input and output clock signals.

The described embodiments are well suited for network-based routers and switches where it may be desirable to reduce the frequency of a clock signal to conserve power during times when the data processing load being processed by the network device is below its maximum processing capacity. However, the described embodiments may also be applied to any clocking digital system where it is desired to reduce a core clock frequency during periods of low activity. For example, if the frequency of the VCO output signal is 6 GHz and a divide-by-2 setting is applied at the output of the VCO, the input clock to a programmable divider will be at 3 GHz. A programmable output divider that can seamlessly change in real time from 1 to 63 will provide 64 different output frequencies in a range from approximately 47.62 MHz to 3 GHz in steps that are adjustable by the divide-by-2/3 setting and an integer variable provided to the programmable divider. When a divide-by-3 circuit is applied at the output of the VCO, the input clock to the programmable divider will be at 2 GHz. A similar line of reasoning will yield 31.75 MHz to 2 GHz for the divide-by-3 setting. If greater control, i.e., a smaller frequency step is desired, one or both of the divide-by setting or the integer number of steps provided by the programmable divider can be adjusted. The exact frequencies provided will depend on the VCO center frequency. A VCO with a tuning range of, for example, +/−20% together with the divide-by-2 or 3 circuit and an appropriately configured programmable divider can support a full range of prevailing router and network design architectures.

Figure 2:
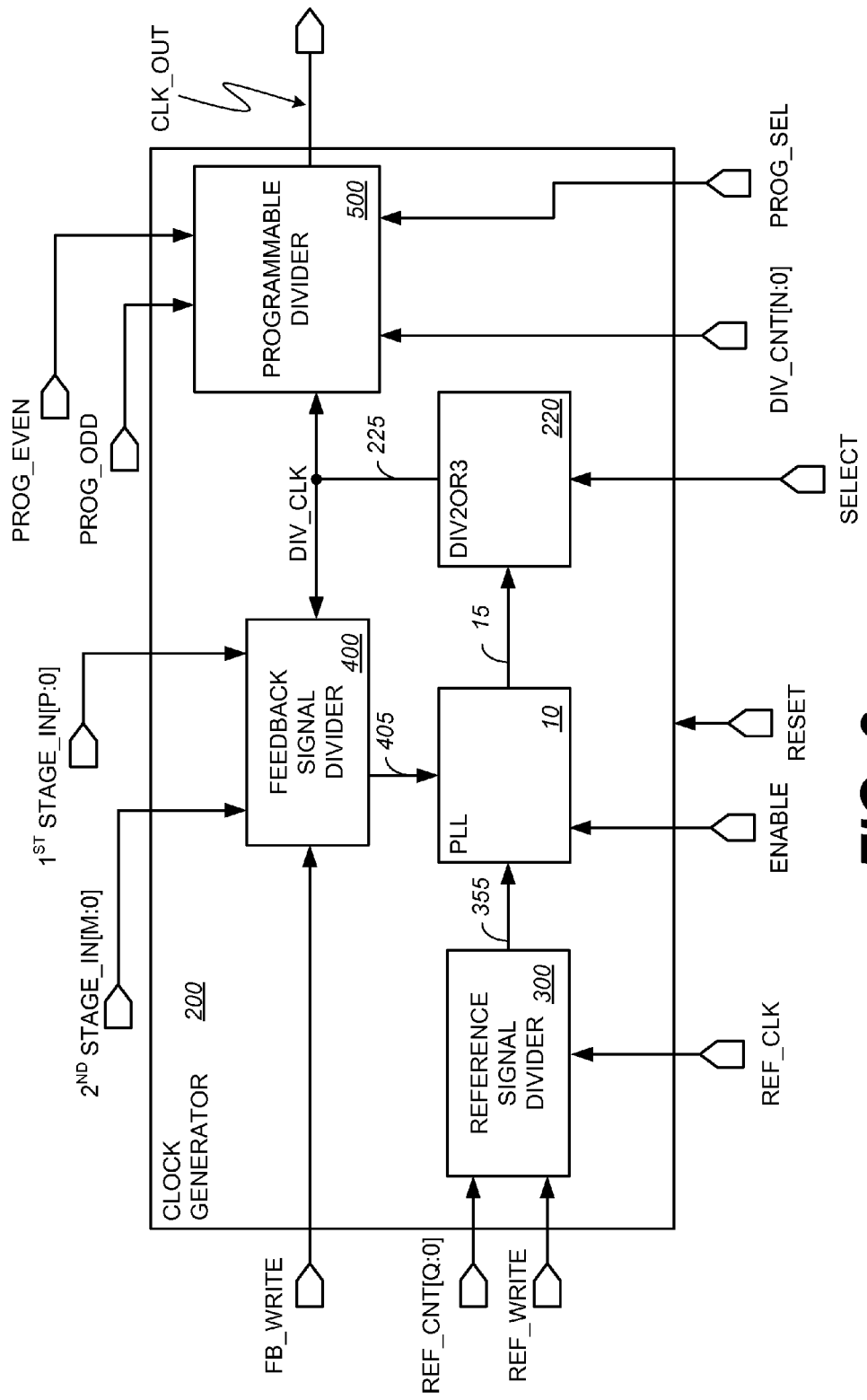
FIG. 2 is a functional block diagram illustrating an embodiment of a clock generator.

FIG. 2 is a functional block diagram illustrating an embodiment of a clock generator 200. The clock generator 200 receives a host of input signals and generates a controllably adjustable output signal (CLK_OUT). The clock generator 200 includes a divide-by-2 or 3 circuit 220 and a feedback signal divider 400 arranged in a feedback signal path of a PLL 10. A reference signal divider 300 provides a modified clock signal on connection 355 to an input of the PLL 10. The PLL 10 operates in accordance with enable signal (ENABLE) and reset signal (RESET) inputs. The reset signal is forwarded to control logic within each of the reference signal divider 300, the feedback signal divider 400, and the programmable divider 500, respectively. The reset signal initializes core and post-processing logic sub-elements within each of the reference signal divider 300, the feedback signal divider 400, and the programmable divider 500. An output of the PLL 10 is coupled to an input of the divide-by-2 or 3 circuit 220 by connection 15. The divide-by-2 or 3 circuit 220 divides the signal received on connection 15 by two or by three in accordance with the SELECT input. The divide-by-2 or 3 circuit 220 is not real-time adjustable. A programmable divider 500 is coupled to the output of the divide-by-2 or 3 circuit 220 by connection 225.

The reference signal divider 300 receives a reference clock signal REF_CLK. The reference signal divider 300 operates in accordance with a reference count word (REF_CNT[Q:0]) and a reference write input (REF_WRITE). The reference signal divider 300 forwards the value of the reference count word to a sequential counter in response to a pulse received on the reference write input. Once started by internal control logic, the sequential counter decrements Q times, where Q is an integer, in accordance with the reference clock signal. At Q and Q>>1 (the binary right shifted by 1 value of Q) separate pulses (START_CNT and CLK_HALF) are generated within the reference signal divider 300. Thereafter, in accordance with post-processing logic, which includes SR-latch functionality, the reference signal divider 300 generates an output pulse, which is forwarded to the PLL 10 on the connection 355. Repetition of this process results in a first periodic signal on connection 355. An embodiment of the reference signal divider 300 will be described in greater detail in association with the functional block diagram of FIG. 3.

The PLL 10 generates an output signal on connection 15 having a frequency that, through operation of the divide-by-2 or 3 circuit 220 and the feedback signal divider 400, is urged into a fixed frequency relationship with the first periodic signal received on connection 355. PLLs such as the PLL 10 are well known and need not be described for those skilled in the art to understand the improved clock generator 200 and methods for generating a frequency adjustable clock signal.

The feedback signal divider 400 receives the DIV_CLK signal on connection 225 and provides a feedback signal on connection 405 to the PLL 10. The feedback signal is responsive to a first stage input signal ($1^{st}$ STAGE_IN[P:0]) and a second stage input signal ($2^{nd}$ STAGE_IN[M:0]). The first stage input signal and the second stage input signal are controllably strobed into respective registers of the feedback signal divider 400 in accordance with the FB_WRITE signal. As shown in further detail and described in association with FIG. 4, the feedback signal divider 400 can be implemented as two series coupled instances of the reference signal divider 300.

The programmable divider 500 receives the DIV_CLK signal on connection 225 and generates an output signal CLK_OUT. The programmable divider 500 operates in accordance with PROG_EVEN, PROG_ODD, PROG_SEL and DIV_CNT[N:0] signal inputs. The programmable divider 500 includes odd and even signal paths. The separate signal paths include respective state machines that operate in accordance with the DIV_CLK signal on connection 225. The respective state machines count down from the input word DIV_CNT[N:0] to one. The state machines send respective pulses to post-processing logic associated with each state machine. As with the reference divider, the two pulses are combined with a SR-latch mechanism to generate a divide-by-N waveform. But unique to the programmable divider 500, additional post-processing logic reshapes the CLK_OUT signal into a half duty cycle waveform. In a bypass mode of operation, the programmable divider selectively applies the DIV_CLK signal at its output (CLK_OUT).

As illustrated in FIG. 2, each functional block of the clock generator 200 operates in accordance with at least one input signal. The input signals can be generated and modified as may be desired by an associated controller or processor (not shown). Portions of the controller or processor may be supported by software or firmware. When supported by software, it should be understood that various data values and logic, may be stored on any computer-readable medium for use by or in connection with any computer-related system or method. The term logic is used to describe a self-contained collection of executable instructions that is used in combination with other components to initialize functional elements, monitor the same and optimize results.

In the context of this document, a computer-readable medium is an electronic, magnetic, optical, or other physical device or mechanism that can contain or store a computer program and data for use by or in connection with a computer-related system or method. The computer-readable medium can be any means that can store, communicate, propagate, or transport the program for use by or in connection with the instruction execution system, apparatus, or device. The various logic elements and stored values may be embodied in any computer-readable medium for use by or in connection with an instruction execution system, apparatus, or device, such as a computer-based system, processor-containing system, or other system that can fetch the instructions from the instruction execution system, apparatus, or device and execute the instructions.

The computer readable medium can be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection (electronic) having one or more wires, a portable computer diskette (magnetic), a random access memory (RAM) (electronic), a read-only memory (ROM) (electronic), an erasable programmable read-only memory (EPROM, EEPROM, or Flash memory) (electronic), an optical fiber (optical), and a portable compact disc read-only memory (CDROM) (optical). Note that the computer-readable medium could even be paper or another suitable medium upon which the program is printed, as the program can be electronically captured, for instance via optical scanning of the paper or other medium, then compiled, interpreted or otherwise processed in a suitable manner if necessary, and then stored in a computer memory.

In an alternative embodiment, the external controller or processor can be implemented in hardware. For example, the external controller or processor can be implemented with any or a combination of the following technologies, which are each well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc.

Data values may be stored in a memory coupled to the external controller or processor. The memory may include any one or combination of volatile memory elements (e.g., random access memory (RAM, such as DRAM, SRAM, SDRAM, etc.)) and nonvolatile memory elements (e.g., ROM, hard drive, tape, CDROM, etc.). Moreover, the memory may incorporate electronic, magnetic, optical, and/or other types of storage media. Note that the memory can have a distributed architecture, where various components are situated remote from one another, but can be accessed by the controller or processor.

Software and/or logic stored in memory may include one or more separate programs, each of which comprises an ordered listing of executable instructions for implementing logical functions. The memory may include a suitable operating system (O/S) (not shown) and perhaps other application(s) or programs. The operating system essentially controls the execution of other computer programs and provides scheduling, input-output control, file and data management, memory management, and communication control and related services.

Figure 3:
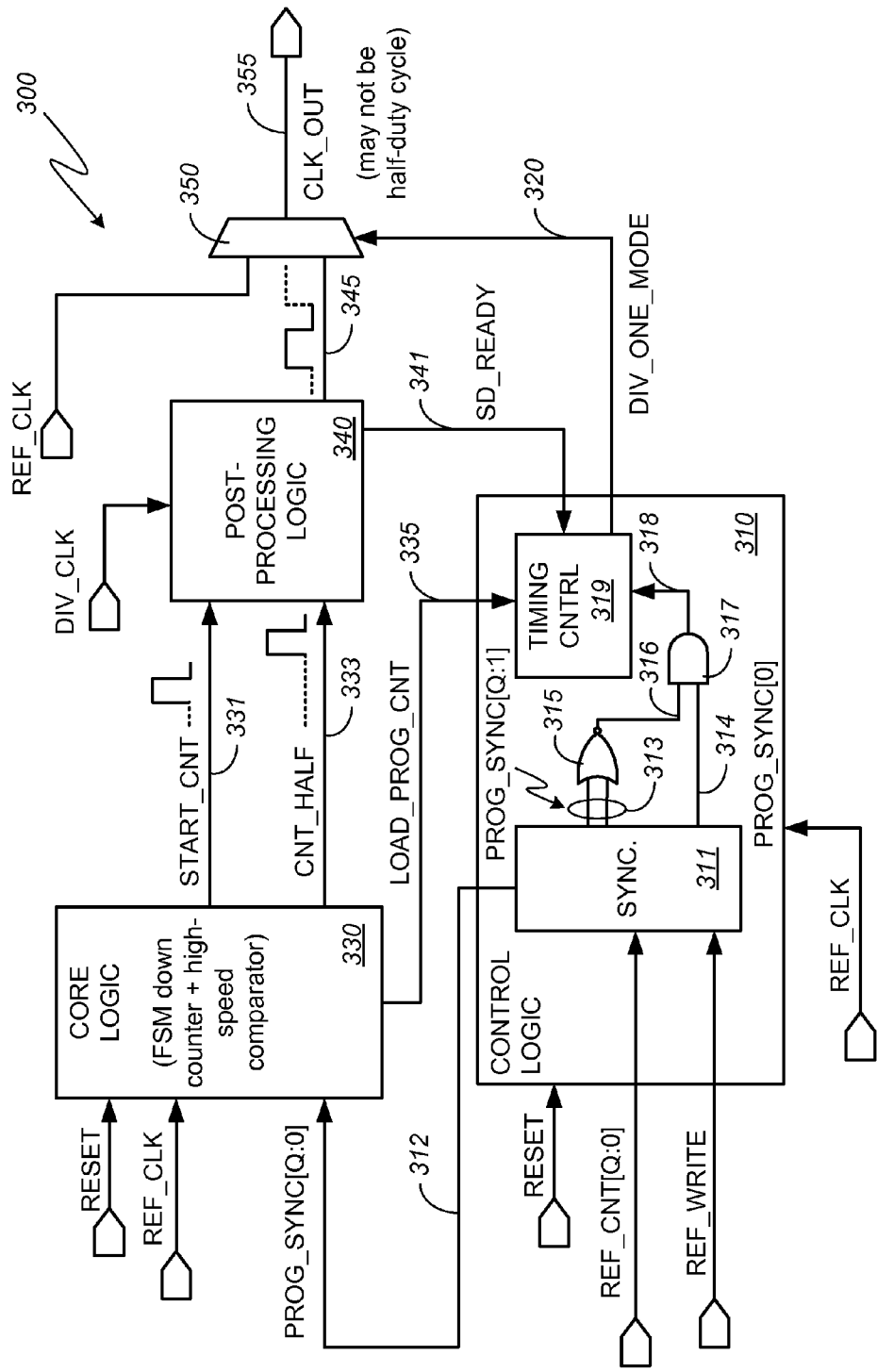
FIG. 3 is a functional block diagram illustrating an embodiment of the reference signal divider of FIG. 2.

FIG. 3 is a functional block diagram illustrating an embodiment of the reference signal divider 300 of FIG. 2. The reference signal divider 300 includes control logic 310, core logic 330, post-processing logic 340, and multiplexer 350. The reference signal divider 300 operates in accordance with a reference count word (REF_CNT[Q:0]), a reference write input (REF_WRITE), and an externally provided reference clock (REF_CLK). Inputs REF_CNT[Q:0] and REF_WRITE are conditioned with a synchronizer circuit 311 to facilitate an asynchronous but sequential write operation. The control logic 310 forwards the synchronized value of the REF_CNT[Q:0] word (PROG_SYNC[Q:0]) on connection 312 to a downward sequential counter in the core logic 330 in response to a pulse on REF_WRITE or RESET. In turn, core logic 330 issues a LOAD_PROG_CNT signal on connection 335 to gate synchronizer operation. Cyclically, the sequential counter in the core logic 330 decrements Q times, where Q is an integer, in accordance with the reference clock signal (REF_CLK).

The core logic 330 operates in accordance with the synchronized value PROG_SYNC[Q:0] and the REF_CLK. The core logic 330 includes a finite state machine (FSM) down counter and a high-speed comparator (not shown). At count Q a START_CNT pulse is generated and forwarded on connection 331 to post-processing logic 340. At count Q>>1 a CNT_HALF pulse is generated and forwarded on connection 333 to post-processing logic 340.

The post-processing logic 340 receives the START_CNT and CNT_HALF pulses and reshapes the START_CNT and CNT_HALF inputs to a periodic but not necessarily half duty cycle clock, which is forwarded on connection 345 to an input of the multiplexer 350. A second input of the multiplexer 350 is coupled to the REF_CLK. The reference signal divider 300 selects one of the periodic signal on connection 345 or the REF_CLK signal to forward on connection 355 in accordance with a DIV_ONE_MODE control signal. The DIV_ONE_MODE signal is conditioned by both a feedback control signal SD_READY from post-processing logic 340 and the LOAD_PROG_CNT signal from the core logic 330. A timing control element 319, which consists of gate and flip-flop signal regeneration components, operates in accordance with NOR gate 315 and AND gate 316. The NOR gate 315 receives the PROG_SYNC[Q:1] word on inputs 313 and forwards an output in accordance with NOR logic on connection 316 which is coupled to a first input of the AND gate 317. A second input of the AND gate 317 receives the PROG_SYNC[0] signal on connection 314 from the synchronizer 311. An output in accordance with AND gate logic is coupled to the timing control element 319 by connection 318. When the DIV_ONE_MODE control signal is enabled, the reference signal divider 300 forwards the REF_CLK on connection 355. Otherwise, when the DIV_ONE_MODE control signal is disabled the reference signal divider 300 forwards the periodic signal on connection 355. The multiplexer 350 controllably switches between the reference clock signal at its first input and the periodic signal on connection 345 in a glitch free manner in response to a divide by one mode control signal on connection 320 as provided by the control logic 310.

Figure 4:
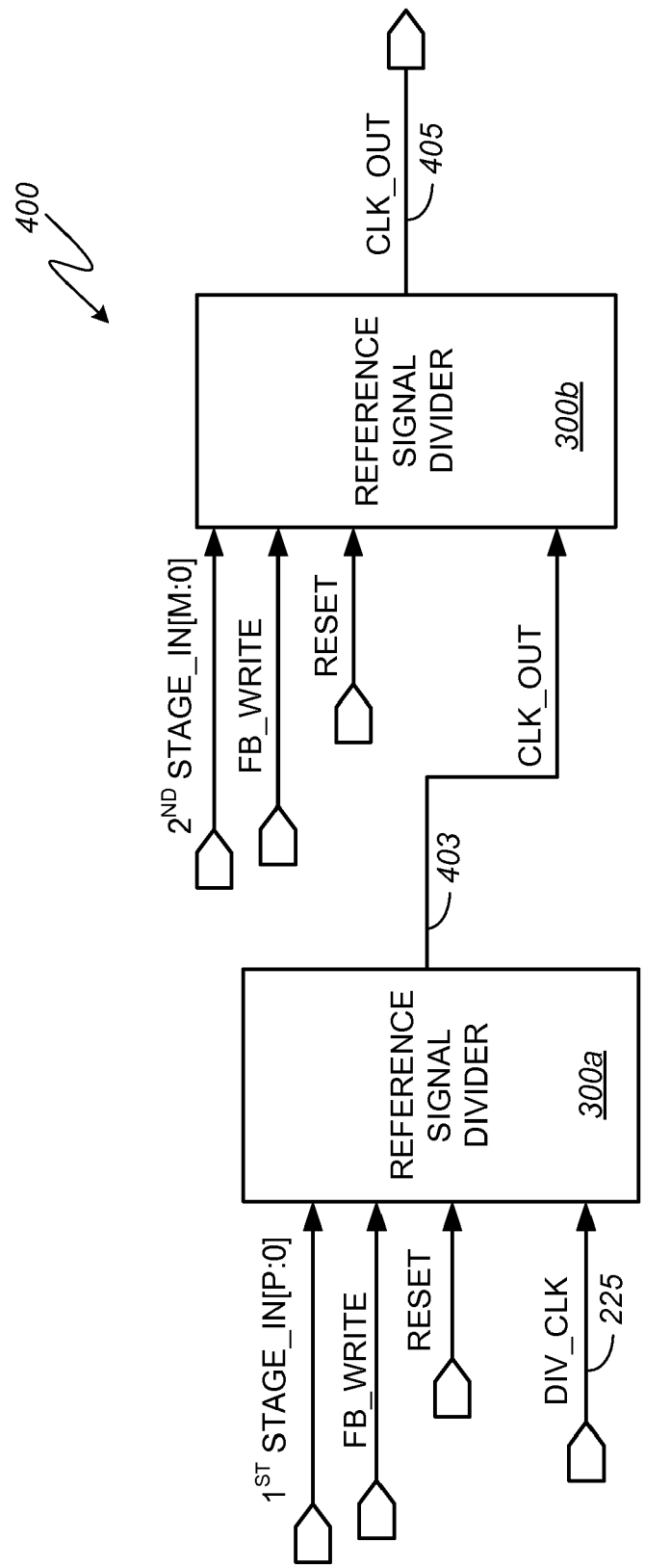
FIG. 4 is a functional block diagram illustrating an embodiment of the feedback signal divider of FIG. 2.

FIG. 4 is a functional block diagram illustrating an embodiment of the feedback signal divider 400 of FIG. 2. The feedback signal divider 400 includes a first reference signal divider 300a and a second reference signal divider 300b. The DIV_CLK signal on connection 225 (FIG. 2) is coupled to the reference clock input of the first reference signal divider 300a. The CLK_OUT signal generated by the first reference signal divider 300a is coupled to the reference clock input of the second reference signal divider 300b by connection 403. The first reference signal divider 300a and the second reference signal divider 300b are separately initialized by an external reset signal (RESET). The first reference signal divider 300a and the second reference signal divider 300b operate in accordance with respective words, feedback write inputs (FB_WRITE), and clock signals. The first reference signal divider 300a receives the 1$^{st}$ STAGE_IN[P:0] word and the DIV_CLK signal, whereas the second reference signal divider 300b receives the 2$^{nd}$ STAGE_IN[M:0] word and the CLK_OUT signal from the first reference signal divider 300a. In response to a pulse received on a respective feedback write (FB_WRITE) input, control logic (not shown), associated with each instance of a reference signal divider 300, forwards the value of the respective word to a sequential counter in core logic. Once started by the respective control logic, the sequential counter decrements Q times, where Q is an integer, in accordance with the respective clock signal (DIV_CLK/CLK_OUT). Post-processing logic (not shown), associated with the reference signal divider 300a, generates a first pulse (CLK_OUT) that is coupled to the reference input of the reference signal divider 300b. The post-processing logic (not shown), associated with the reference signal divider 300b, generates a second pulse (CLK_OUT) that is coupled by connection 405 to the feedback input of the PLL 10 (FIG. 2).

Figure 5:
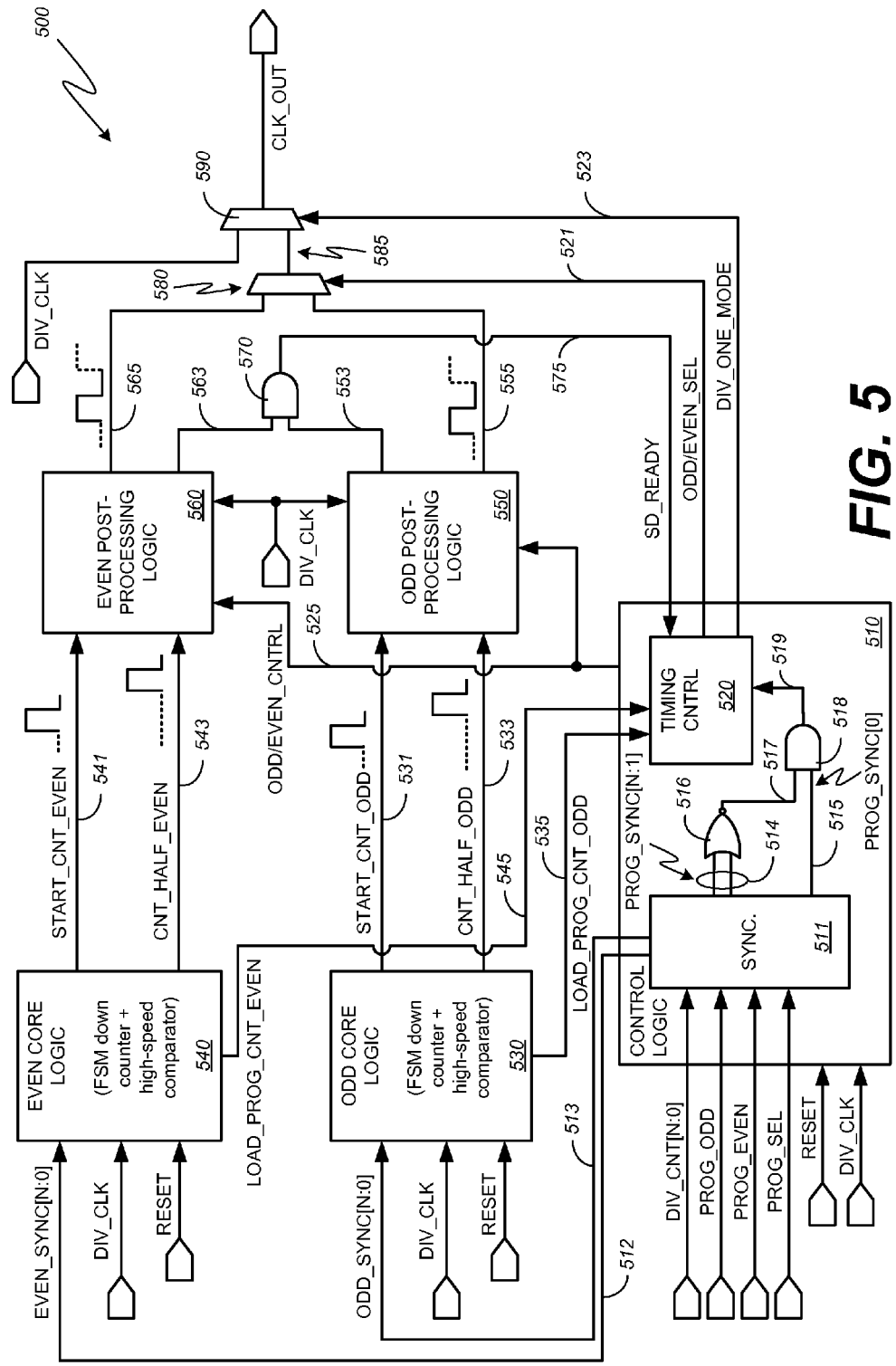
FIG. 5 is a functional block diagram illustrating an embodiment of the programmable divider of FIG. 2.

FIG. 5 is a functional block diagram illustrating an embodiment of the programmable divider 500 of FIG. 2. The programmable divider 500 includes control logic 510, odd core logic 530, even core logic 540, odd post-processing logic 550, even post-processing logic 560, AND-logic gate 570, multiplexer 580, and multiplexer 590. Unlike the reference divider 300 and the feedback divider 400, which each contain similar control logic and core logic, the programmable divider 500 includes separate logic paths embodied in the respective odd/even core logic and odd/even post-processing elements. Control of the separate logic paths is managed by the control logic element 510 in the programmable divider 500.

The DIV_CLK on connection 225 is used to synchronously drive the control logic 510, even core logic 530 and odd core logic 540. The control logic 510 receives programmable word (DIV_CNT[N:0]), program odd (PROG_ODD), program even (PROG_EVEN), program select (PROG_SEL) and reset (RESET) input signals. As previously described, one or more of these signals can be generated in an external controller or processor configured to work in conjunction with the clock generator 200. The control logic 510 forwards an even synchronization counter signal (EVEN_SYNC[N:0]) to the even core logic 540 on connection 512 and an odd synchronization counter signal (ODD_SYNC[N:0]) to the odd core logic 530 on connection 513. These signals are responsive to the DIV_CNT[N:0] input received at the control logic 510 and may be triggered either by a pulse on PROG_EVEN or PROG_ODD respectively. Additionally, RESET will also effect a DIV_CNT[N:0] write operation with intelligence to the correct synchronization counter depending on bit DIV_CNT[0]. The control logic 510 generates and forwards an odd/even control (ODD/EVEN_CTRL) signal to the odd post-processing logic 550 and the even post-processing logic 560 on connection 525. This signal is used to selectively enable functionality in the active path (e.g., the even core logic 540 and even post-processing logic 560) and conversely disable functionality in the other path (e.g., the odd core logic 530 and odd post-processing logic 550). In addition, the control logic 510 generates and forwards an odd/even select (ODD/EVEN_SEL) signal to the multiplexer 580 on connection 521. The control logic 510 conditions the various input signals to eliminate metastability in the programmable divider 500. The control logic 510 also provides a bypass mode via the DIV_ONE_MODE signal on connection 523, which is coupled to the select input of multiplexer 590 when the input word on DIV_CNT[N:0] indicates that the programmable divider 500 should apply an integer divisor of one.

The DIV_ONE_MODE signal is conditioned by both a feedback control signal SD_READY from AND gate 570, the LOAD_PROG_CNT_ODD signal on connection 535 from the odd core logic 530, and the LOAD_PROG_CNT_EVEN signal on connection 545 from the even core logic 540. A timing control element 520, which consists of gate and flip-flop signal regeneration components, operates in accordance with NOR gate 516 and AND gate 518. The NOR gate 516 receives the PROG_SYNC[N:1] word on inputs 514 and forwards an output in accordance with NOR logic on connection 517 which is coupled to a first input of the AND gate 518. A second input of the AND gate 518 receives the PROG_SYNC [0] signal on connection 515 from the synchronizer 511. An output in accordance with AND gate logic is coupled to the timing control element 520 on connection 519.

The odd core logic 530 includes a finite state machine (not shown) that functions in accordance with the odd synchronization counter signal (ODD_SYNC[N:0]) and DIV_CLK. The even core logic 540 includes a second state machine (not shown) that functions in accordance with the even synchronization counter signal (EVEN_SYNC[N:0]) and DIV_CLK.

The first and second state machines each comprise a sequential counter that is configured to count down from the programmed value to one in accordance with a common reference clock (DIV_CLK). Both the odd core logic 530 and the even core logic 540 will trigger the respective post-processing logic via a first output (START_CNT_EVEN/ODD) and a second output (CNT_HALF_EVEN/ODD) when one of the sequential counters therein is at N and N>>1, respectively. The START_CNT_EVEN pulse is coupled to the even post processing logic 560 on connection 541. The CNT_HALF_EVEN pulse is coupled to the even post processing logic 560 on connection 543. The START_CNT_ODD pulse is coupled to the odd post processing logic 550 on connection 531. The CNT_HALF_ODD pulse is coupled to the odd post processing logic 550 on connection 533. The odd post-processing logic 530 generates a half duty cycle clock (ODD_CLK) that is coupled to a first input of the multiplexer 580 on connection 555 and a control pulse that is coupled to a first input of the AND-logic gate 570 on connection 553. Similarly, the even post-processing logic 560 generates a respective half duty cycle clock (EVEN_CLK) that is coupled to a second input of the multiplexer 580 on connection 565 and a similar timing control pulse that is coupled to a second input of the AND-logic gate 570 on connection 563. When both ready signals on connections 553 and 563 are logic high, the AND-logic gate 570 forwards a pulse (SD_READY) on connection 575 to the control logic 510 indicating that a valid timing window exists to transition from a current divider path to the other divider path. In response, the timing controller 520 adjusts the ODD/EVEN_SEL signal on connection 521 to select one of the EVEN_CLK (i.e., the signal on connection 565) and the ODD_CLK (i.e., the signal on connection 555) to forward at the output of the multiplexer 580. Accordingly, a new programmed word results in a transition to a new output frequency when the sequential counters in each of the odd core logic 530 and the even core logic 540 have counted to one at the same reference clock edge. A respective SR-latch functionality (not shown) in each of the odd post-processing logic 550 and the even post-processing logic 560 cascaded with signal processing using logic gates generates a half duty cycle clock signal responsive to the divide-by-N waveform provided by the associated core logic element.

To write a word into the odd core logic 530 and the even core logic 540, the DIV_CNT[N:0] is set to the desired value, which in a preferred embodiment ranges from a value of one to sixty-three. A DIV_CNT[N:0] value of zero is not allowed. An active low strobe pulse is sent on one of the PROG_ODD and PROG_EVEN inputs. When the PROG_ODD pulse is sent, the odd core logic 530 is updated. When the PROG_EVEN pulse is sent, the even core logic 540 is updated. After a finite delay, the odd core logic 530 and the even core logic 540 are initialized. The PROG_SEL input is toggled logic low if the programmed value is an even integer and toggled logic high if the programmed value is an odd integer. As described above, the switch to the new output frequency associated with the programmed value will only occur when both state machines (i.e., the sequential counters) line up at the count of one. The AND-logic gate 570 ensures that both the odd post-processing logic 550 and the even post-processing logic 560 are aligned. A reset to the programmable divider 500 provides a simultaneous word write to both the odd core logic 530 and the even core logic 540. The odd core logic 530 and the even core logic 540 are configured to not start at the same programmed value even if the same value of N is input on EVEN_SYNC and ODD_SYNC. Switchover from the ODD_CLK to the EVEN_CLK occurs only when both clock signals are low. A second level of multiplexing using multiplexer 590 with DIV_CLK similar to the mechanism described for reference divider 300 provides a divide-by-1 functionality. Accordingly, the multiplexer 580 output signal EVEN_ODD_CLK_OUT on connection 585 will be free of undesirable transitions.

Similar to reference divider 300, LOAD_PROG_CNT_EVEN/ODD exists to time the loading of DIV_CNT[Q:0] and PROG_EVEN/ODD and PROG_SEL, which can be asynchronous but sequential. Additionally, LD_PROG_COUNT_EVEN/ODD together with SD_READY and DIV_ONE_MODE jointly determine a valid timing window to toggle between divide-by-one, EVEN_CLK and ODD_CLK. The multiplexer 580 controllably switches between the first clock signal on connection 565 and the second clock signal on connection 555 in a glitch free manner in response to an ODD/EVEN_SEL signal on connection 521 as provided by the timing controller 520 within the control logic 510. The multiplexer 590 controllably switches between the divided clock signal generated by the divide-by-2/3 element 220 (FIG. 2) and one of the first clock signal and the second clock signal forwarded by the multiplexer 580 in a glitch free manner in response to DIV_ONE_MODE signal on connection 523 as provided by the timing controller 520 within the control logic 510.

Figure 6:
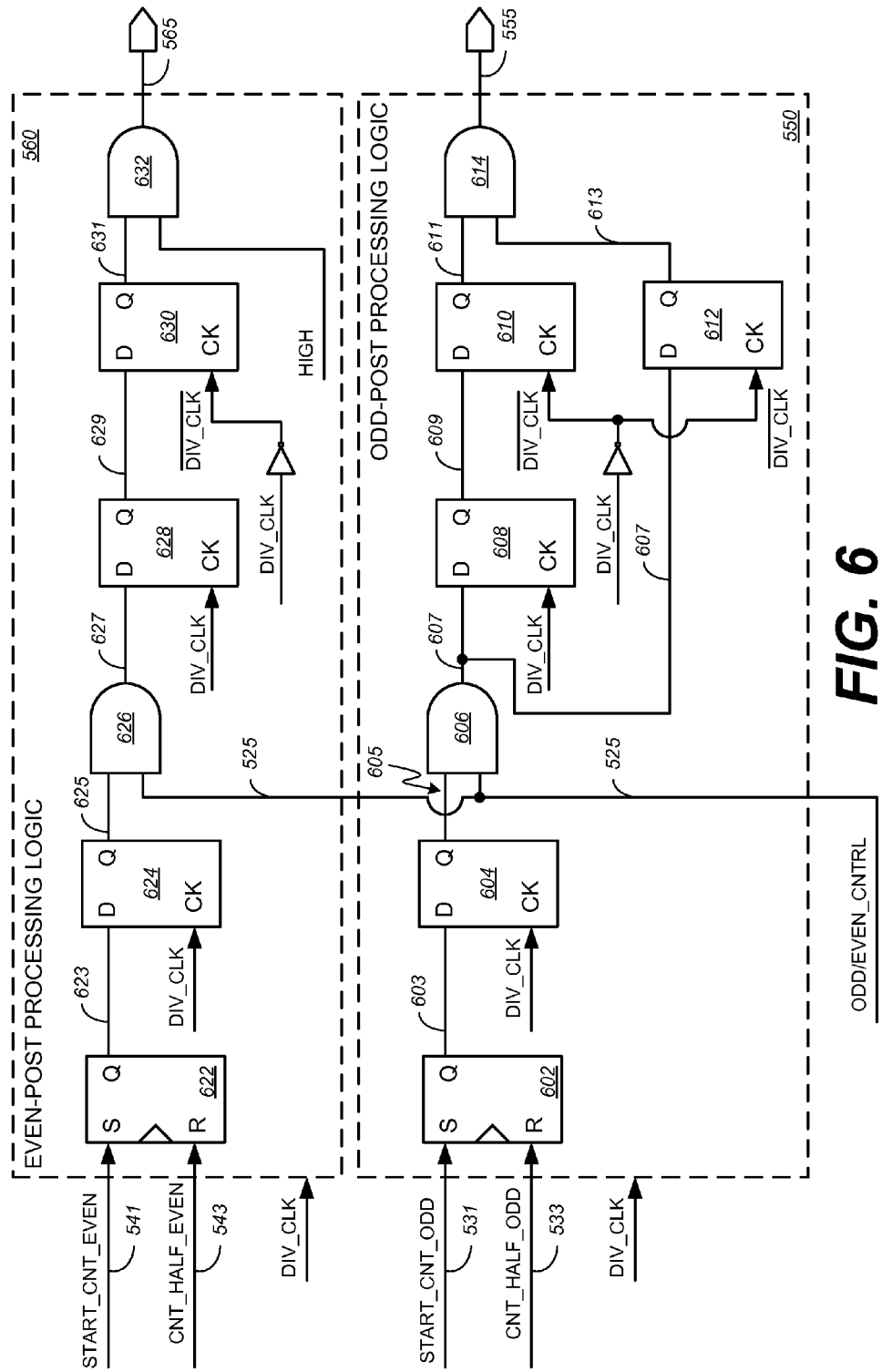
FIG. 6 is a functional block diagram illustrating an embodiment of the odd post-processing logic and even-post processing logic of the programmable divider of FIG. 5.

FIG. 6 is a functional block diagram illustrating an embodiment of the odd post-processing logic 550 and even-post processing logic 560 of the programmable divider 500 of FIG. 5. Both the odd-post processing logic 550 and the even post-processing logic 560 receives the DIV_CLK from the divide-by-2 or 3 circuit 220 and an ODD/EVEN_CNTRL signal on connection 525 from the control logic 510. In addition, the odd post-processing logic 550 receives the START_CNT_ODD signal on connection 531 and the CNT_HALF_ODD signal on connection 533. Whereas, the even post-processing logic 560 receives the START_CNT_EVEN signal on connection 541 and the CNT_HALF_EVEN signal on connection 543.

The odd post-processing logic 550 includes S-R latch 602, D flip-flop 604, AND gate 606, D flip-flop 608, D flip-flop 610, D flip-flop 612 and AND gate 614. The "S" input of the S-R latch 602 receives the START_CNT_ODD signal on connection 531. The "R" input of the S-R latch 602 receives the CNT_HALF_ODD signal on connection 533. The output of the S-R latch 602 is coupled to the data input of D flip-flop 604 by connection 603. The output of the D flip-flop 604 is coupled to a first input of the AND gate 606 by connection 605. A second input of the AND gate 606 receives the ODD/EVEN_CNTRL signal. The output of the AND gate 606 is coupled to the data input of the D-flip-flop 608 and the data input of the D flip-flop 612 by connection 607. The output of the D flip-flop 608 is coupled to the data input of D flip-flop 610 by connection 609. The output of the D flip-flop 610 is coupled to a first input of AND gate 614 by connection 611. The output of the D flip-flop 612 is coupled to a second input of the AND gate 614 by connection 613. As illustrated in FIG. 6, the clock inputs of D flip-flop 604 and D flip-flop 608 receive the DIV_CLK signal, while the clock inputs of D flip-flop 610 and D flip-flop 612 receive the inverted DIV_CLK signal. The output of AND gate forwards a half-duty cycle output signal on connection 555.

The even post-processing logic 560 includes S-R latch 622, D flip-flop 624, AND gate 626, D flip-flop 628, D flip-flop 630, and AND gate 632. The "S" input of the S-R latch 622 receives the START_CNT_EVEN signal on connection 541. The "R" input of the S-R latch 622 receives the CNT_HALF_EVEN signal on connection 543. The output of the S-R latch 622 is coupled to the data input of D flip-flop 624 by connection 623. The output of the D flip-flop 624 is coupled to a first input of the AND gate 626 by connection 625. A second input of the AND gate 626 receives the ODD/EVEN_CNTRL signal. The output of the AND gate 626 is coupled to the data input of the D-flip-flop 628 by connection 627. The output of the D flip-flop 628 is coupled to the data input of D flip-flop 630 by connection 629. The output of D flip-flop 630 is coupled to a first input of AND gate 632 by connection 631. A second input of the AND gate 632 is coupled to a logic high signal. As illustrated in FIG. 6, the clock inputs of D flip-flop 624 and D flip-flop 628 receive the DIV_CLK signal, while the clock input of D flip-flop 630 receive the inverted DIV_CLK signal. The output of AND gate 632 forwards a half-duty cycle output signal on connection 565.

The EVEN/ODD path processing capitalizes on the property that the comparator in the even core logic 540 and the comparator in the odd core logic 530 produce a pair of output pulses that is equidistant in time for the paired signals START_CNT_EVEN on connection 541 and CNT_HALF_EVEN on connection 543 but is consistently slightly skewed for the paired signals START_CNT_ODD on connection 531 and CNT_HALF_ODD on connection 533. The result is that the output from S-R latch 622 is always half-duty cycle, while the output from S-R latch 602 has an additional clock cycle in the active high state. For example, this means that while operating in a divide by 5 mode, the output from S-R latch 602 on connection 603 will be logic high for 3 DIV_CLK pulses and logic low for 2 DIV_CLK pulses.

D flip-flop 624 and D flip-flop 604 clean up finite gate delay introduced by the respective S-R latch. Note that gate delay reduces the timing budget and in effect reduces the maximum operating frequency of the high-speed design. The ODD/EVEN_CNTRL signal activates the current divider path and de-activates the other divider path. For both the EVEN post-processing logic path and the ODD post-processing logic paths, the signal passes through two sequential elements, the first clocked by DIV_CLK and the second by the inverse of DIV_CLK. In the ODD post-processing logic path, the output from the two sequential elements is logically AND-ed with the output from a single sequential element (i.e., the output of D flip-flop 612) to reshapes the signal on connection 605 to half duty cycle. For the EVEN post-processing logic path, the output of D flip-flop 630 on connection 631 is logically AND-ed with an input signal that is permanently logical high. The high degree of symmetry between the EVEN and ODD post-processing logic paths results in negligible skew and a high degree of consistency in practical implementations, for example, on silicon. Simultaneously, the pipelining latency through the respective paths is also taken advantage of in the timing control 520 to compute the necessary control signals. This implementation reaps all the benefits associated with an all-digital approach.

Figure 7:
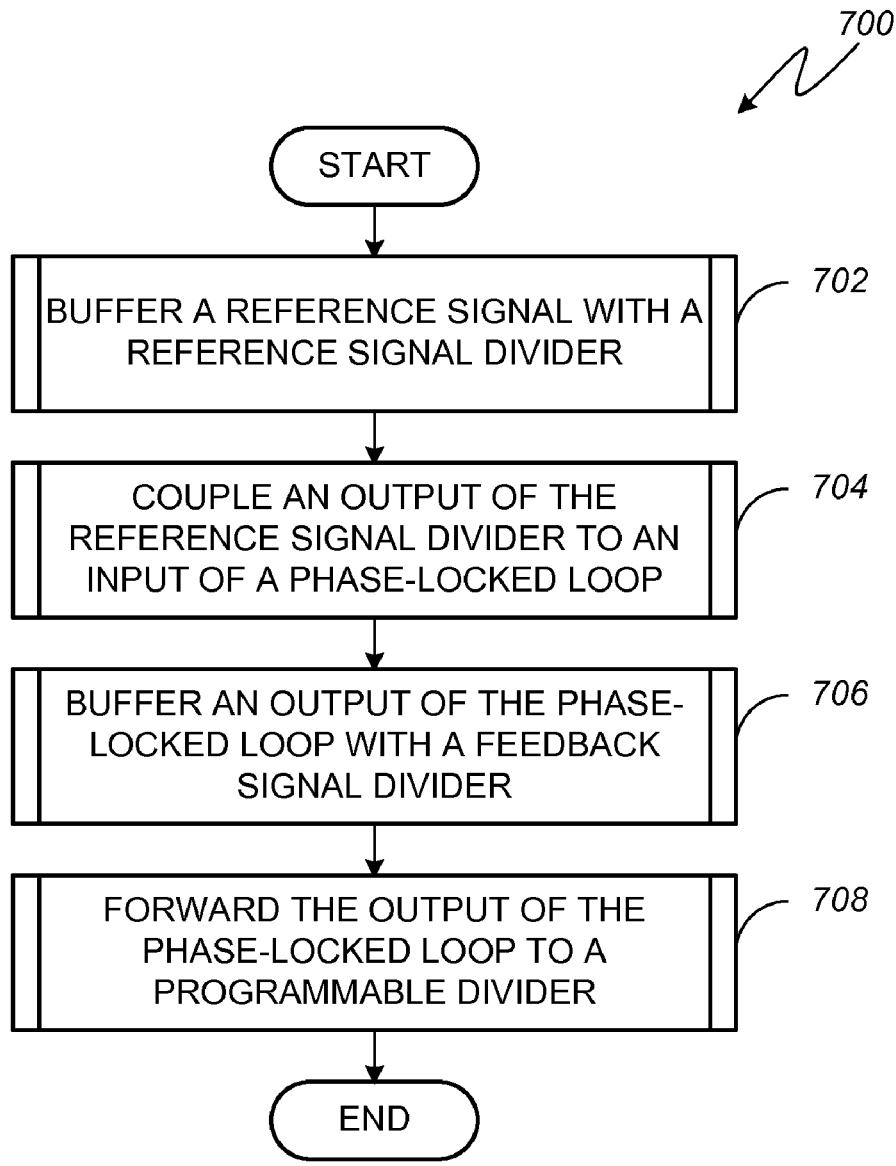
FIG. 7 is a flow diagram illustrating an example embodiment of a method for generating a frequency adjustable clock signal.

FIG. 7 is a flow diagram illustrating an example embodiment of a method 700 for generating a frequency adjustable clock signal. The method begins with block 702 where a reference signal is buffered with a reference signal divider, such as the reference signal divider 300. In block 704, an output of the reference signal divider 300 is coupled to an input of a PLL 10. In block 706, an output of the PLL 10 is buffered with a feedback signal divider 400 before being applied at an input of the PLL 10. As described above, the feedback signal divider 400 is a scaled version of the programmable divider 500 and the reference signal divider 300. In this regard, the feedback signal divider 400 differs from feedback in prior art PLLs, which can consist of a connection between the output and the comparator of the PLL (i.e., a divide by one element). In block 708, the output of the PLL 10 is forwarded to a programmable divider 500.

The reference signal divider 300, which is a scaled version of the programmable divider 500, receives a digital word representing an integer value, sequentially counts from the integer value to one, and forwards a pair of pulses to post-processing logic within the reference signal divider 300. The post-processing logic generates an output signal and a divider ready signal. The divider ready signal is forwarded to the control logic within the reference signal divider 300 to maintain stability. The output signal becomes the reference clock for the PLL 10.

The feedback signal divider 400 is also a scaled version of the programmable divider 500. The feedback signal divider 400 is implemented by cascading two reference signal dividers 300 in series with each other. Thus, the feedback signal divider 400 receives two digital words representing two integer values. Each stage of the feedback signal divider 400 sequentially counts from the integer value to one and forwards a pulse to post-processing logic within the respective stage of the feedback signal divider 400. The post-processing logic generates a pulse and a divider ready signal. When both divider ready signals are active, the feedback signal divider sends a feedback pulse to a comparator within the PLL 10. The PLL 10 compares the reference clock signal provided by the reference signal divider 300 with the feedback signal forwarded from the feedback signal divider 400 and adjusts the voltage controlled oscillator within the PLL 10 to align the two signals.

Figure 8:
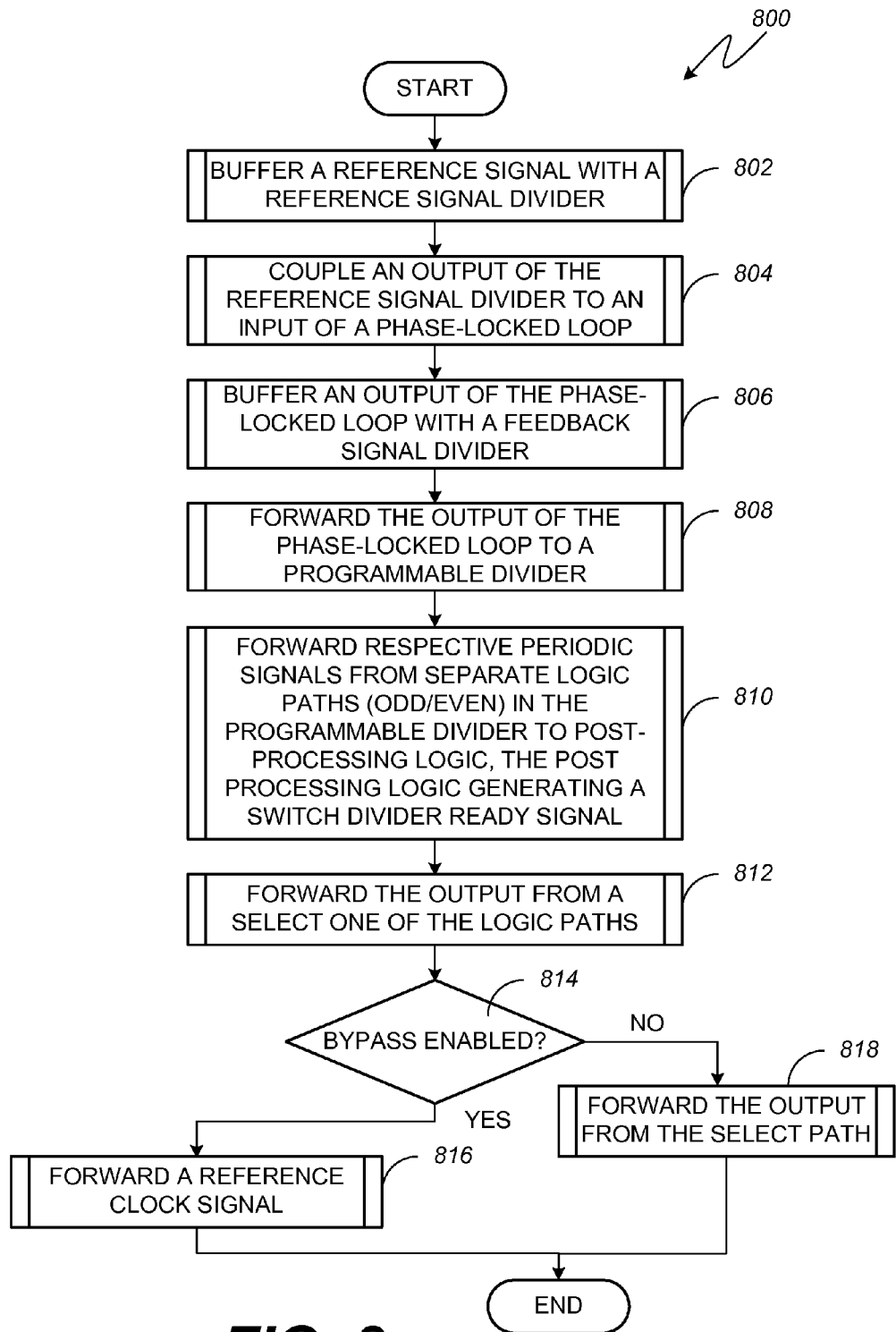
FIG. 8 is a flow diagram illustrating an alternative embodiment of a method for generating a frequency adjustable clock signal.

FIG. 8 is a flow diagram illustrating an example embodiment of a method 800 for generating a frequency adjustable clock signal with the clock generator 200. The method begins with block 802 where a reference signal is buffered with a reference signal divider, such as the reference signal divider 300. In block 804, an output of the reference signal divider 300 is coupled to an input of a PLL 10. In block 806, an output of the PLL 10 is buffered with a feedback signal divider 400 before being applied at an input of the PLL 10. In block 808, the output of the PLL 10 is forwarded to a programmable divider 500. In block 810, the programmable divider forwards respective periodic signals from separate logic paths (e.g., an even logic path and an odd logic path) to post-processing logic. As further shown in block 810, the post-processing logic generates a switch divider ready signal. The switch divider ready signal is communicated to the timing controller 520 to coordinate the transition from one of the even logic path to the odd logic path. In block 812, the periodic signal from a select one of the logic paths is communicated to additional post-processing logic. Thereafter, in decision block 814, it is determined whether a bypass mode is enabled. When the bypass mode is enabled, the clock generator 200 forwards the reference clock signal at the system output, as shown in block 816. Otherwise, when the bypass mode is disabled, the clock generator 200 forwards the output signal form the select path, as indicated in block 818.

The foregoing description has been presented for purposes of illustration and description. It is not intended to be exhaustive or to limit the scope of the claims to the precise forms disclosed. Modifications or variations are possible in light of the above teachings. The example embodiments were chosen and described to enable one of ordinary skill to make and use the present systems and methods for controllably adjusting a clock signal over a wide range of frequencies. It is to be understood that the invention is defined by the appended claims and is not limited to the specific embodiments.

What is claimed is:

1. A self-contained clock generation system for generating a real-time programmable clock signal, the clock generation system, comprising:
a reference signal divider generating a first periodic signal in response to a reference clock;
a phase-locked loop coupled to receive the first periodic signal and configured to generate a frequency controlled output signal;
a programmable divider including control logic, core logic, and post-processing logic, the programmable divider coupled to receive the output signal and generate a frequency controlled clock signal, the reference signal divider and the programmable to divider responsive to real-time changes in respective inputs to achieve real-time control of phase-locked loop input and output signals, the core logic generating a divide-by-N waveform that is forwarded to the post-processing logic, where N is an integer and the post-processing logic generates a half duty cycle clock signal responsive to the divide-by-N waveform.

2. The system of claim 1, wherein the control logic conditions input signals to eliminate metastability.

3. The system of claim 1, wherein the control logic provides a bypass mode for an integer divisor of one.

4. The system of claim 1, wherein the core logic includes a first state machine and a second state machine that each receive a common reference clock and operate within separate logic paths, the separate logic paths minimizing skew and duty cycle distortion introduced by variations in the semiconductor manufacturing process, operational voltage, and temperature.

5. The system of claim 4, wherein the first state machine and the second state machine each comprise a sequential counter.

6. The system of claim 5, wherein the first state machine and the second state machine forward a pulse to the post-processing logic when one of the first state machine and the second state machine is at the programmed value.

7. The system of claim 5, wherein the first state machine and the second state machine forward a pulse to the post-processing logic when one of the first state machine and the second state machine is at a binary left-shifted value with respect to the programmed value.

8. The system of claim 5, wherein an asynchronously introduced new programmed word results in a transition to a new output frequency when the first state machine and the second state machine have both count to one.

9. The system of claim 1, wherein the reference signal divider is a scaled version of the programmable divider.

10. The system of claim 1, further comprising:
a first multiplexer arranged to receive a reference clock signal at a first input and a periodic signal from post-processing logic, the first multiplexer controllably switching between the reference clock signal and the periodic signal in a glitch free manner in response to a divide by one control signal from the control logic.

11. The system of claim 1, further comprising:
a feedback signal divider that includes a series connection of two reference signal dividers, the reference signal divider and the feedback signal divider each including a single logic path for dividing the reference signal and the PLL output signal respectively.

12. The system of claim 1, wherein the programmable divider generates a signal when a valid timing window exists to transition from a current divider logic path to the other divider logic path.

13. The system of claim 1, further comprising:
a second multiplexer arranged to receive a first clock signal from an even logic path and a second clock signal from an odd logic path, the second multiplexer controllably switching between the first clock signal and the second clock signal in a glitch free manner in response to the control logic; and
a third multiplexer arranged to receive a divided clock signal and one of the first clock signal and the second clock signal from the second multiplexer, the third multiplexer controllably switching between the divided clock signal and one of the first clock signal and the second clock signal from the second multiplexer in a glitch free manner in response to the control logic.

14. A method for generating a frequency adjustable clock signal, the method comprising:
buffering a reference clock signal with a reference signal divider;
coupling an output of the reference signal divider to an input of a phase-locked loop;
buffering an output of the phase-locked loop with a feedback signal divider; and
forwarding the output of the phase-locked loop to a programmable divider, the programmable divider applying separate logic paths, the separate logic paths minimizing skew and duty cycle distortion introduced by variations in the semiconductor manufacturing process, operational voltage, and temperature.

15. The method of claim 14, wherein buffering a reference clock signal with a reference signal divider comprises:
receiving a digital word representing an integer value; and
sequentially counting from the integer value to one.

16. The method of claim 14, further comprising:
forwarding respective periodic signals from the separate logic paths to post-processing logic, the post-processing logic generating a switch divider ready signal and selectively forwarding one of the respective periodic signals or a reference clock signal.

17. The method of claim 14, wherein buffering an output of the phase-locked loop with a feedback signal divider further comprises:
coupling two reference signal dividers in series;
receiving a digital word representing an integer value; and
sequentially counting from the integer value to one.

18. The method of claim 14, wherein forwarding the output of the phase-locked loop to a programmable divider comprises forwarding input signals to control logic that applies a synchronizer circuit to avoid metastability.

19. The method of claim 14, wherein forwarding the output of the phase-locked loop to a programmable divider comprises forwarding an integer value to first and second state machines.

20. The method of claim 19, wherein the first and second state machines sequentially count from a received integer value to one.

21. The method of claim 19, wherein the first and second state machines sequentially count from the integer value to one before resetting.

22. The method of claim 21, wherein a transition to a new frequency occurs when both the first and second state machines have reached one.

* * * * *